United States Patent
Grodzki (10) Patent No.: US 10,151,811 B2
(45) Date of Patent: Dec. 11, 2018

(54) METHOD FOR PRODUCING AN MR IMAGE AND CORRESPONDINGLY DESIGNED MAGNETIC RESONANCE SCANNER

(71) Applicant: Siemens Aktiengesellschaft, Munich (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 863 days.

(21) Appl. No.: 14/595,776

(22) Filed: Jan. 13, 2015

(65) Prior Publication Data

US 2015/0198685 A1    Jul. 16, 2015

(30) Foreign Application Priority Data

Jan. 13, 2014   (DE) ................ 10 2014 200 406

(51) Int. Cl.
*G01R 33/32* (2006.01)
*G01R 33/48* (2006.01)

(52) U.S. Cl.
CPC ......... *G01R 33/4818* (2013.01); *G01R 33/32* (2013.01); *G01R 33/4816* (2013.01)

(58) Field of Classification Search
CPC . G01R 33/4818; G01R 33/32; G01R 33/4816
USPC ........................................ 324/309
See application file for complete search history.

(56) References Cited

U.S. PATENT DOCUMENTS

| 5,545,991 | A | * | 8/1996 | Nauerth | G01R 33/4818 324/307 |
| 5,926,021 | A | * | 7/1999 | Hennig | A61B 5/055 324/300 |
| 2011/0187368 | A1 | | 8/2011 | Grodzki | |
| 2012/0074938 | A1 | * | 3/2012 | Grodzki | G01R 33/4824 324/309 |

OTHER PUBLICATIONS

Stradiotti et al., Metal-Related Artifacts in Instrumented Spine. Techniques for reducing artifacts in CT and MRI: state of the art, May 2009, Eur Spine J, S102-S108.*
Parasoglou et al., Quantitative single point imaging with compressed sensing, 2009, Journal of Magnetic Resonance.*
Ramos-Cabrer et al. "MRI of Hip Prostheses Using Single-Point Methods: In Vitro Studies Towards the Artifact-Free Imaging of Individuals With Metal Implants"; Magnetic Resonance Imaging; vol. 22; (2004) pp. 1097-1103.
Parasoglou et al. "Quantitative Single Point Imaging with Compressed Sensing"; Journal of Magnetic Resonance Medicine, vol. 201, (2009) pp. 72-80.

* cited by examiner

*Primary Examiner* — Susan S Lee
(74) *Attorney, Agent, or Firm* — Schiff Hardin LLP (57) ABSTRACT

In a method and a magnetic resonance (MR) scanner for producing an MR image of a volume portion of a scanned object, MR data are acquired by repeatedly executing the following step of radiating an RF excitation pulse, applying magnetic field gradients for spatial encoding of a magnetization excited by the RF excitation pulse, with only two directions in space being encoded by the spatial encoding, and acquiring essentially a single k-space point for each radiated RF excitation pulse. An MR image is reconstructed from the MR data thusly acquired.

13 Claims, 4 Drawing Sheets

METHOD FOR PRODUCING AN MR IMAGE AND CORRESPONDINGLY DESIGNED MAGNETIC RESONANCE SCANNER

BACKGROUND OF THE INVENTION

Field of the Invention

The present invention relates to a method for producing magnetic resonance (MR) images wherein, for acquiring MR data, essentially only one point in k-space is sampled on the basis of an RF excitation pulse. The present invention also relates to a correspondingly designed magnetic resonance scanner.

Description of the Prior Art

For an MR scan, it is customary according to the prior art to fill so-called k-space, which corresponds to the Fourier transform of the signal measured in the image domain, with scan data. A memory organized as k-space is usually filled line-by-line by acquiring, on the basis of the same RF pulse, a series of k-space points along a line during readout. Apart from Cartesian line-by-line sampling, k-space can be filled along any trajectory, e.g. along radial or spiral trajectories. Always on the basis of the same RF pulse, a particular number of k-space points are acquired directly one after another on the respective trajectory during the same readout.

More rarely according to the prior art, so-called single point imaging (SPI) is used. Here the MR data is acquired in the k-space such that, on the basis of the same RF pulse, generally only one measuring point or rather k-space point is captured, so that during a repetition only a single k-space point (or only a very small number of k-space points compared to the number of k-space points of a k-space line) is acquired. The advantage of single point imaging is that it is extremely robust, as the encoding time (i.e. the time between excitation and data acquisition) can be maintained constant for all the k-space points.

However, the disadvantage of single point imaging is that it is very time-consuming. For example, to acquire the MR data at an isotropic resolution of 1 mm and a matrix size of 128*128*16, a scan time of 30 minutes may be required, which is much too long for everyday clinical practice.

SUMMARY OF THE INVENTION

An object of the present invention is to reduce the scan time for single point imaging compared to the prior art.

According to the present invention, a method is provided for producing an MR image of a volume portion of an examination object by means of a magnetic resonance scanner. This method includes the following steps.

MR data are acquired by repeatedly executing the following sub-steps.

An RF excitation pulse is radiated into a subject.

Apply magnetic field gradients for spatial encoding of the magnetization of nuclear spins in the subject excited by the RF excitation pulse, wherein only two directions in space (and not the third) are encoded by this spatial encoding. In other words, only two magnetic field gradients are used, so that the essentially single k-space point to be acquired in the next step is defined in only two directions in space (and not in the third) by the spatial encoding produced by the magnetic field gradients.

Essentially a single k-space point is acquired. For every RF excitation pulse applied, only one or significantly fewer than the average number of k-space points of a k-space line are inventively acquired. If on average n k-space points are acquired for each k-space line, the essentially single k-space point can have less than n/10 k-space points.

Following these sub-steps, the MR image is reconstructed according to the MR data acquired.

In contrast to the prior art, only k-space points within a plane are acquired with the present invention. This advantageously enables the MR data acquisition time to be greatly reduced compared to the prior art where k-space points are acquired in three-dimensional space.

Within the scope of the present invention, another method for producing an MR image of a volume portion of an examination object using a magnetic resonance scanner is provided. Similar to the first described method according to the invention, the other inventive method includes the steps of acquiring MR data, and reconstructing the MR image according to the MR data acquired.

Here, the MR data acquisition includes a first acquisition of the MR data in a central region of k-space and a second acquisition of the MR data outside of this central region of k-space. The central region of k-space is a region that includes the center of k-space and in particular has a point-symmetric shape with respect to the k-space center. If k-space is, for example, only two-dimensional, i.e. slice-shaped, the central region can then be, for example, a circular surface whose central point corresponds to the center of k-space.

For the first acquisition of the MR data, the following steps are repeatedly implemented: an RF excitation pulse is radiated, magnetic field gradients are applied for spatial encoding of the magnetization of nuclear spins excited by the RF excitation pulse, wherein only two directions in space are encoded by this spatial encoding, and essentially a single k-space point is acquired for the RF excitation pulse that was radiated.

In other words the first MR data acquisition corresponds to the MR data acquisition step from the first described method according to the invention.

For the second MR data acquisition, the following steps are repeatedly carried out in the following sequence: another RF excitation pulse is radiated and k-space points lying on a radial spoke which in turn corresponds to a section of a straight line passing through the k-space center. This straight line section or spoke begins at the outer edge of the central k-space region and ends at an outer boundary of k-space.

For the second MR data acquisition, MR data thus are not acquired using single point imaging, but rather line-by-line, i.e. all the k-space points of a spoke are acquired on the basis of an RF excitation pulse.

In other words, the other method according to the invention combines the advantages of the inventive single point imaging, which is carried out according to the first described method according to the invention, with the advantages of line-by-line acquisition of the MR data. Advantageously, the important k-space points lying in the central region of k-space are acquired using the inventive single point imaging, whereas the k-space points lying outside the central region are effectively acquired using a known and quick method.

As described for the two methods according to the invention, spatial encoding takes place in two spatial directions only, so that effectively a position within a plane is encoded. For the third spatial direction, which is perpendicular to the plane, the two following variants are used in accordance with the invention.

In a first variant, the RF excitation pulse is selectively radiated, by a slice selection gradient being simultaneously applied during the selective RF excitation pulse. This slice selection gradient is in a direction perpendicular to the aforementioned in which the spatial encoding occurs. In other words, a slice is excited by the RF excitation pulse, so that spatial encoding in two directions is sufficient to acquire a k-space point.

In the second variant, during the acquisition of the MR data, no other magnetic field gradient (either for slice selection or spatial encoding) is applied in the third direction perpendicular to the spatial encoding plane. Therefore, for the acquisition of a k-space point, effectively all the information along the third direction is acquired. The reconstructed MR image corresponds to a so-called projection scan. The RF excitation pulse is not selective in this variant.

In addition to the advantage that only two-dimensional k-space has to be sampled for acquiring the MR data, the advantage of the two variants described above is that no fold-overs can occur in the third spatial direction which is often a problem with conventional single point imaging, for example, even if this were only to acquire k-space points within one plane.

Advantageously, the two magnetic field gradients in the last described variant (projection scan) can also be applied during injection of the non-selective RF excitation pulse.

The advantage of applying the magnetic field gradients during injection of the RF excitation pulse is that the magnetic field gradients can effectively produce their effect immediately after the RF excitation pulse, so that the encoding time (i.e. the time between RF excitation and the instant of acquisition of the k-space point or points), and therefore the time taken to acquire all the MR data is in total somewhat shorter than if the magnetic field gradients do not have to be, or must not be, ramped up until after the end of the RF excitation pulse. In addition, a scan during which the magnetic field gradients must be switched on and off for each scan frequency is very noisy, which can be a problem in everyday clinical practice and which is avoided with a projection scan (i.e. the second variant).

According to a preferred embodiment of the invention, the essentially one k-space point corresponds to just a single k-space point. In this embodiment, a single measuring point in k-space is sampled after or in respect of each RF excitation by in particular acquiring the free induction signal. Because of the short echo time and the direct or pure phase encoding for spatial encoding, the single point imaging is virtually unaffected by B0 field inhomogeneities, by magnetic susceptibility variations, and by chemical shift artifacts.

However, the methods according to the invention are also designed to include so-called enhanced single point imaging. With said enhanced single point imaging, the free induction signal is repeatedly sampled at successive (e.g. identical) time intervals, wherein a plurality of measurement points (e.g. ten) in k-space are acquired without, for example, the RF excitation pulse being re-generated each time to acquire each of said k-space points, as is the case with the previously described 'pure' single point imaging.

In addition, it is possible for k-space to be only incompletely sampled for acquisition of the MR data. For this purpose, for example, random k-space points, which are acquired by means of single point imaging according to the invention, are determined using an algorithm as a function of a predefined acceleration factor. This algorithm is designed such that the resulting undersampling is less, the shorter the distance of the k-space point from the k-space center. In other words, the probability of a k-space point being acquired according to the invention is higher, the shorter the distance of the k-space point from the k-space center. The information concerning k-space points not acquired is ascertained by reconstructing the MR image using compressed sampling ("compressed sensing"). The information missing due to the k-space points not acquired can be replaced by iterative reconstruction of the MR image and a priori knowledge about the MR image to be reconstructed.

Using compressed sampling enables acceleration by up to a factor of 16 to be achieved. With the usual line-by-line sampling of k-space according to the prior art, only complete lines can be omitted for undersampling. On the other hand, single point imaging according to the invention allows k-space to be randomly sampled as required, resulting in higher acceleration factors.

It is inventively possible, after acquisition of the essentially single k-space point and prior to injection of the next RF excitation pulse, to apply, instead of the two magnetic field gradients, a so-called spoiler gradient with which the magnetization is dephased.

The advantage of using such spoiler gradients is that the effect of the latest scan on the immediately succeeding scan is virtually non-existent, as the respective spoiler gradient effectively destroys the magnetization produced by the magnetic field previously applied for spatial encoding.

Instead of the two magnetic field gradients, it is also inventively possible, following acquisition of the essentially single k-space point and prior to injection of the next RF excitation pulse, to apply two other magnetic field gradients for refocussing.

The refocussing causes the magnetization due to the two magnetic field gradients for spatial encoding to be effectively undone again, so that also in this variant the effect of the last scan on the immediately succeeding scan is virtually non-existent.

The methods according to the invention can be used in particular for the imaging of metal parts, e.g. metal implants.

As described above, with single point imaging according to the invention, the encoding time can be kept constant for all the k-space points, so that the methods according to the invention are much less prone to abrupt changes in susceptibility occurring in the vicinity of metal implants than is the case with prior art methods.

Also provided, as part of the present invention, is a magnetic resonance scanner for producing an MR image of a volume portion within an examination object. The magnetic resonance scanner has a basic field magnet, a gradient field system, one or more RF antennas and a control device for controlling the gradient field system and the RF antenna(s), for receiving the scan signals picked up by the RF antenna(s), and for evaluating the scan signals, as well as for producing the MR data. The magnetic resonance scanner is designed to radiate an RF excitation pulse using the RF antenna(s), to apply, by operation of the gradient field system, magnetic field gradients for spatial encoding of a magnetization excited by the RF excitation pulse, and to acquire essentially a single k-space point using the RF antenna(s), wherein only two directions in space are encoded by the spatial encoding. The magnetic resonance scanner reconstructs the MR image from the MR data acquired.

Also provided as part of the present invention is another magnetic resonance scanner for producing an MR image of a volume portion within an examination object. This magnetic resonance scanner has a basic field magnet, a gradient field system, one or more RF antennas and a control device for controlling the gradient field system and the RF antenna(s), receiving the scan signals picked up by the RF antenna(s), and evaluating the scan signals, as well as for producing the MR data. The magnetic resonance scanner is designed to acquire MR data and reconstruct the MR image according to the MR data acquired. The acquisition of the MR data includes a first acquisition of the MR data in a central region of k-space and a second acquisition of the MR data outside the central region. The magnetic resonance scanner is designed to radiate an RF excitation pulse during the first acquisition of the MR data using the RF antenna(s), to introduce, by operation of the gradient field system, magnetic field gradients for spatial encoding of the magnetization of nuclear spins excited by the RF excitation pulse, and to acquire essentially a single k-space point using the RF antenna(s), wherein only two directions in space are encoded by means of spatial encoding. The magnetic resonance scanner is also designed to inject another RF excitation pulse during the second acquisition of the MR data using the RF antenna(s) and to acquire k-space points lying on a radial spoke which is on a straight line passing through the k-space center and begins at an edge of the central k-space region and ends at a k-space boundary.

The advantages of the magnetic resonance scanners according to the invention are essentially the same as the advantages of the methods according to the invention that have been described in detail above.

The present invention also encompasses a non-transitory, computer-readable data storage medium that can be loaded into a memory of a programmable control device or of a processing unit of a magnetic resonance scanner. The storage medium is encoded with programming instructions that cause the computer to perform all or various of the above described embodiments of the inventive methods. The storage medium may require program means, e.g. libraries and auxiliary functions, in order to implement the corresponding embodiments of the methods.

The electronically readable data carrier may be a DVD, a magnetic tape or a USB stick, on which the electronically readable control information, is stored. When this control information is read from the data carrier and stored in a control device or processing unit of a magnetic resonance scanner, all the inventive embodiments of the above described methods can be executed.

The present invention is particularly suitable for acquiring MR data within a volume portion in which, or in the vicinity of which a metal implant is located. Self-evidently, the present invention is not restricted to this preferred field of application, as the present invention can be used wherever there are magnetic field inhomogeneities.

DESCRIPTION OF THE PREFERRED EMBODIMENTS

Figure 1:
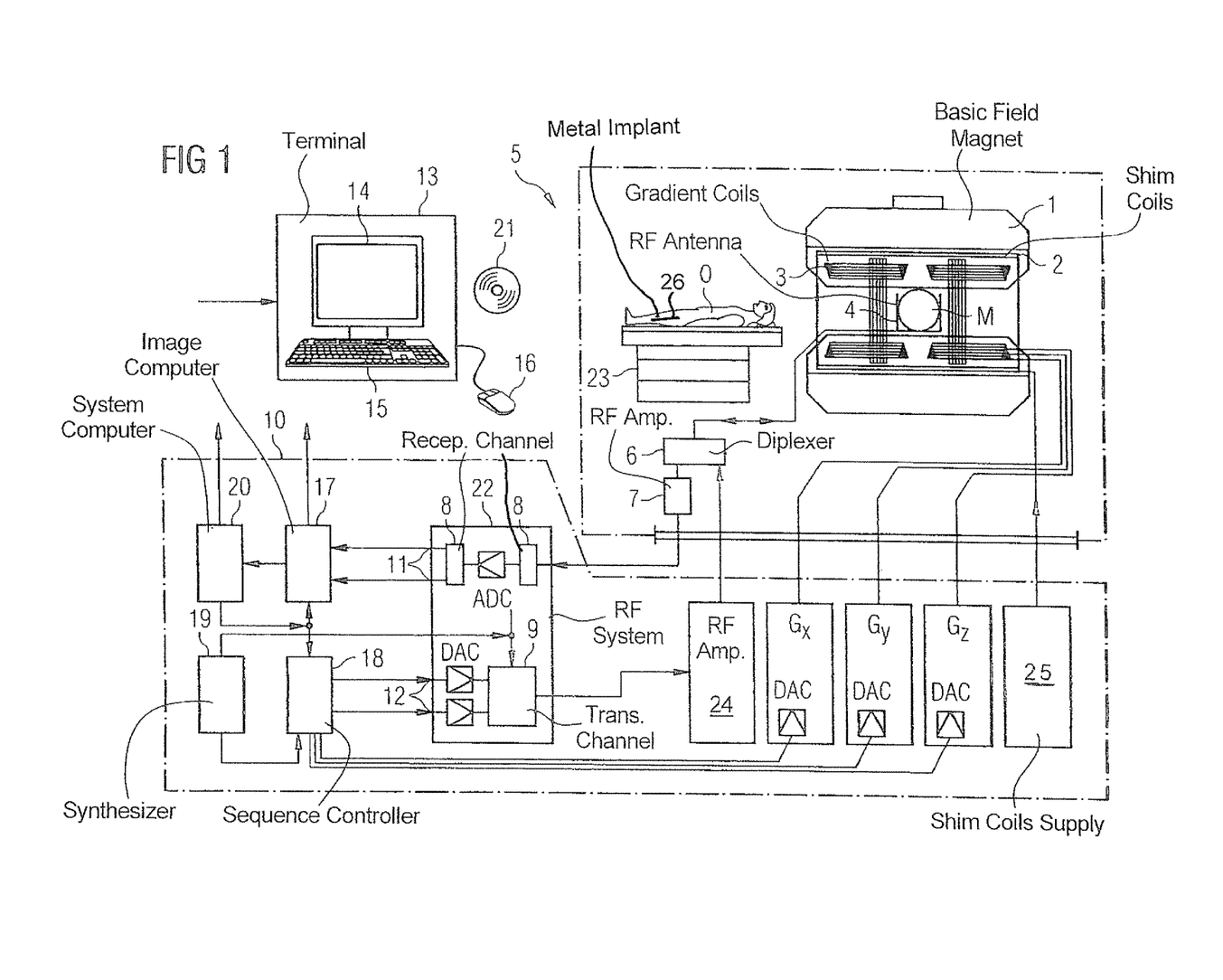
FIG. 1 shows a magnetic resonance scanner according to the invention.

FIG. 1 schematically illustrates a magnetic resonance scanner 5 (a magnetic resonance imaging or tomography machine). A basic field magnet 1 generates a strong, time-invariant magnetic field for polarization or rather orientation of the nuclear spin in a volume portion of an object O, such as e.g. a part under examination of a human body lying on a table 23 in the magnetic resonance scanner 5. The high homogeneity of the main magnetic field required for MR scanning is defined in a typically spherical measurement volume M in which the human body parts to be examined are disposed, wherein this homogeneity may be disturbed by metal objects, such as metal implant 26. To support the homogeneity requirements and in particular eliminate time-invariant effects, shim pieces of ferromagnetic material are mounted at suitable points. Time-variable effects are eliminated by shim coils 2 fed by shim coils supply 25.

A cylindrical gradient field system 3 composed of three sub-windings is used in the basic field magnet 1. Each sub-winding is supplied with power by an amplifier to produce a linear (also time-variable) gradient field in the respective direction of the Cartesian coordinate system. The first sub-winding of the gradient field system 3 produces a gradient $G_x$ in the x-direction, the second sub-winding a gradient $G_y$ in the y-direction, and the third part-winding a gradient $G_z$ in the z-direction. Each amplifier has a digital/analog converter which is controlled by a sequence controller 18 for properly-timed generation of the gradient pulses.

Inside the gradient field system 3 are one or more antennas 4, which convert the RF pulses emitted by an RF power amplifier 24 into an alternating magnetic field to excite the nuclei and orientation of the nuclear spin of the object O to be scanned or more specifically of the region of the object O to be scanned. Each RF antenna 4 consists of one or more RF transmitter coils and one or more RF receiver coils in the form of an annular, preferably linear or matrix-shaped arrangement of component coils. The RF receiver coils of the respective radio-frequency antenna 4 also convert the alternating field arising from the precessing nuclear spins, i.e. in general the spin echo signals produced by a pulse sequence of one, or more radio-frequency pulses and one or more gradient pulses, into a voltage (measurement signal) which is fed via an amplifier 7 to an RF reception channel 8 of a radio-frequency system 22. The radio-frequency system 22 which is part of a control device 10 of the magnetic resonance scanner 5 additionally comprises a transmit channel 9 in which the radio-frequency pulses exciting nuclear magnetic resonance are produced. On the basis of a pulse sequence predefined by the system computer 20, the respective radio-frequency pulses are represented digitally in the sequence controller 18 as a sequence of complex numbers. This sequence of numbers is fed as a real part and imaginary part via respective inputs 12 to a digital/analog converter in the radio-frequency system 22 and from there to a transmit channel 9. In the transmit channel 9, the pulse sequences are modulated onto a radio-frequency carrier signal whose base frequency corresponds to the center frequency.

The switchover from transmitting to receiving mode takes place via a diplexer 6. The RF transmitter coils of the radio-frequency antenna(s) 4 inject the radio-frequency pulses for exciting the nuclear spin into the measurement volume M and resulting echo signals are sampled via the RF receiver coil(s). The correspondingly obtained nuclear resonance signals are demodulated in a phase-sensitive manner to an intermediate frequency in the receive channel 8' (first demodulator) of the radio-frequency system 22, digitized in the analog/digital converter (ADC), and fed out via the output 11. This signal is again demodulated to the frequency 0. Demodulation to the frequency 0 and separation into a real component and an imaginary component takes place after digitization in the digital domain in a second demodulator 8. An MR image or more precisely a three-dimensional image dataset is reconstructed from the thus obtained scan data by an image processor 17. The scan data, the image data and the control programs are administered via the system computer 20. On the basis of predefined control programs, the sequence controller 18 controls the generation of the required pulse sequences and the corresponding sampling of k-space. In particular, the sequence controller 18 controls the properly-timed application of the gradients, the emission of the radio-frequency pulses with defined phase amplitude, and reception of the nuclear resonance signals. The time base for the radio-frequency system 22 and the sequence controller 18 is provided by a synthesizer 19. Corresponding control programs for generating an MR image, which are stored e.g. on a DVD 21, are selected and the MR image is displayed via a terminal 13 comprising a keyboard 15, a mouse 16 and a screen 14.

Figure 2:
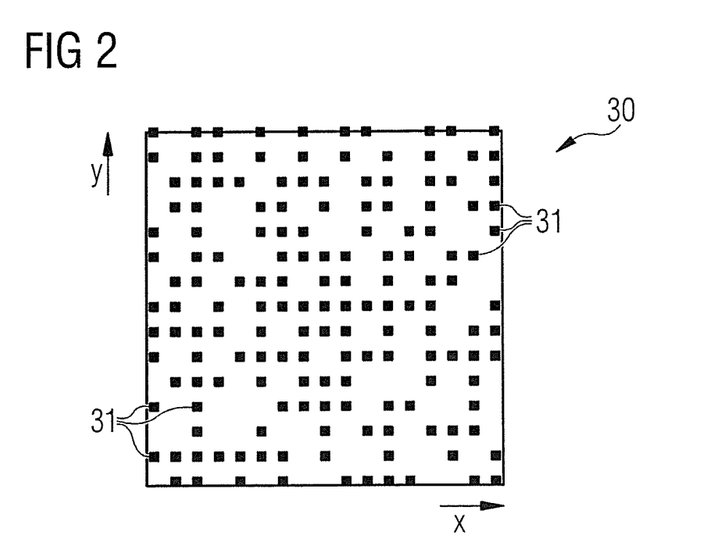
FIG. 2 shows k-space undersampled according to the invention.
Figure 3:
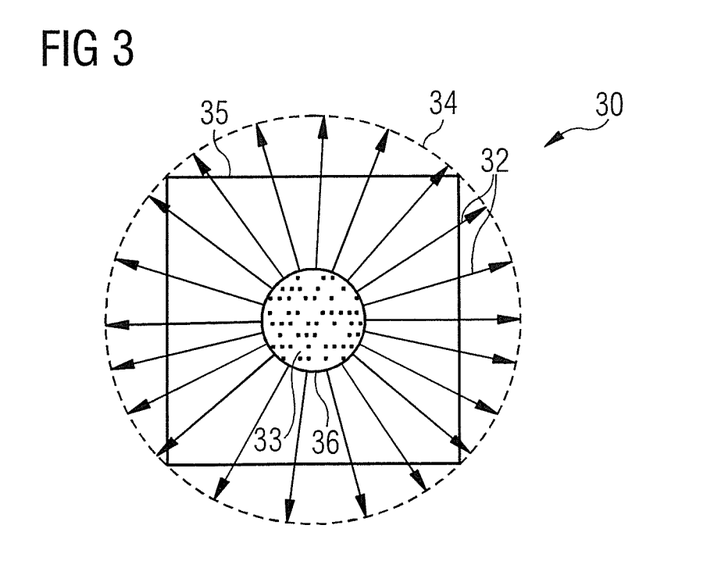
FIG. 3 shows instructions according to the invention for sampling k-space.

FIG. 2 shows an example of the k-space points 31 which are acquired in the case of randomly sampled, two-dimensional k-space 30 extending in the spatial directions x and y. Whereas in the case of linear acquisition of the k-space points a certain statistical dependence exists between the k-space points acquired, the advantage of the single point imaging according to the invention is that any sampling scheme can be implemented, as no dependence of any kind exists between the k-space points to be acquired. FIG. 3 shows another inventive sampling scheme for sampling two-dimensional k-space 30. Within a central region 33 of k-space 30, k-space points are acquired using single point imaging according to the invention. On the other hand, the k-space points outside this central region 33 are acquired on the basis of radial spokes 32 extending in a straight line from the edge 36 of the circular central region 33 to the edge 34 or 35 of k-space 30. The reference character 34 applies to circular k-space 30 and the reference character 35 to square k-space 30. The k-space points lying on a spoke 32 are acquired using a single readout on the basis of a single RF excitation pulse.

Figure 4:
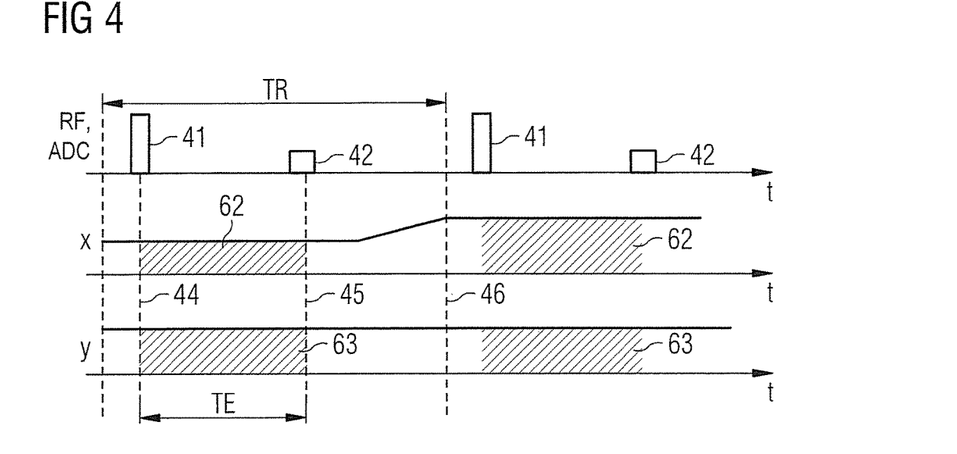
FIG. 4 shows a sequence according to the invention for a projection scan.

FIG. 4 shows a sequence diagram of single point imaging according to the invention for a projection scan. For each k-space point to be acquired, a non-selective RF excitation pulse 41 is applied at a first point in time 44. Using magnetic field gradients 62, 63, wherein one magnetic field gradient 62 is oriented along the x-direction and the other magnetic field gradient 63 along the y-direction, spatial encoding takes place. After an echo time TE or encoding time, the MR data of the k-space point is acquired at a second point in time 45. This sequence is then repeated, resulting in the specified repetition time TR.

As no selective RF excitation pulses 41 are used for the projection scan shown in FIG. 4, the magnetic field gradients 62, 63 can remain applied even during injection of the RF excitation pulses 41.

Figure 5:
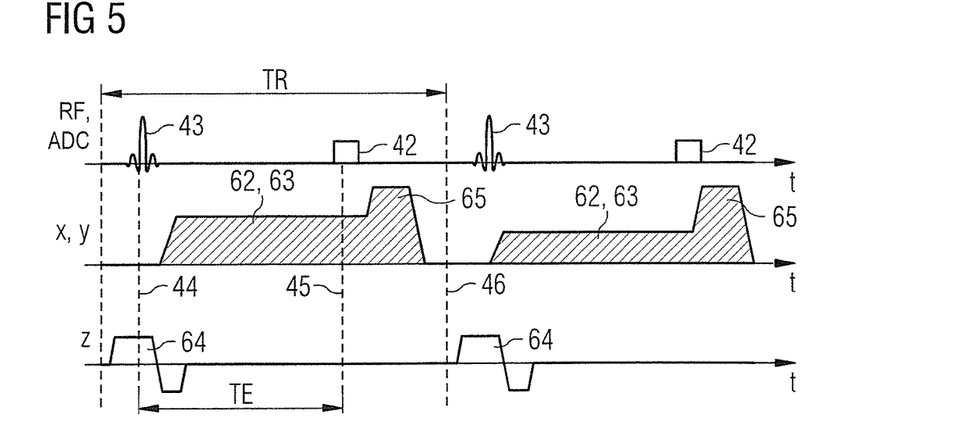
FIG. 5 shows a sequence according to the invention for slice-selective acquisition of k-space.

FIG. 5 shows another sequence diagram of single point imaging according to the invention. Here, simultaneously with the selective RF excitation pulse 43, a slice selection gradient 64 is applied at the first point in time 44 in order to selectively excite the magnetization within a predetermined slice. Because of the selective excitation, the two magnetic field gradients 62, 63 for spatial encoding in the x-direction and the y-direction are not ramped up until after the RF excitation pulse 43. The echo time TE is therefore somewhat longer than in the sequence shown in FIG. 4. The slice selection gradient 64 is oriented along the z-direction and is therefore perpendicular to the directions x, y of the magnetic field gradients 62, 63.

At the second point in time 45 the single k-space point is acquired, which is specified by a time interval 42 at which analog/digital conversion (ADC) of the measured signal takes place. After this acquisition of the k-space point, instead of the magnetic field gradients 62, 63 a spoiler gradient 65 is applied in each case in order to dephase the magnetization. As a result of these spoiler gradients 65, at the third time instant 46, i.e. at the end of the repetition time interval TR or at the start of the next repetition time interval TR, virtually the same conditions in respect of the magnetization are present as at the start of the first repetition time interval TR shown in FIG. 5.

Instead of the two spoiler gradients 65, refocussing gradients can also be applied. Similarly to the spoiler gradients 65, these refocussing gradients are applied after acquisition of the k-space point and are matched in amplitude and duration to the previously applied magnetic field gradients 62, 63 such that they again effectively undo the effect of the latter, i.e. phase shift. In other words, the moments of the respective refocussing gradient 65 and corresponding spatial encoding gradient 62, 63 add up to zero. The amplitude of one of the refocussing gradients 65 therefore has an opposite sign to the amplitude of the corresponding magnetic field gradient 62, 63. Similarly to the spoiler gradients, the refocussing gradients 65 ensure that at the start of the next repetition time interval TR virtually the same conditions in respect of the magnetization are present as at the start of the previous repetition time interval TR.

Figure 6:
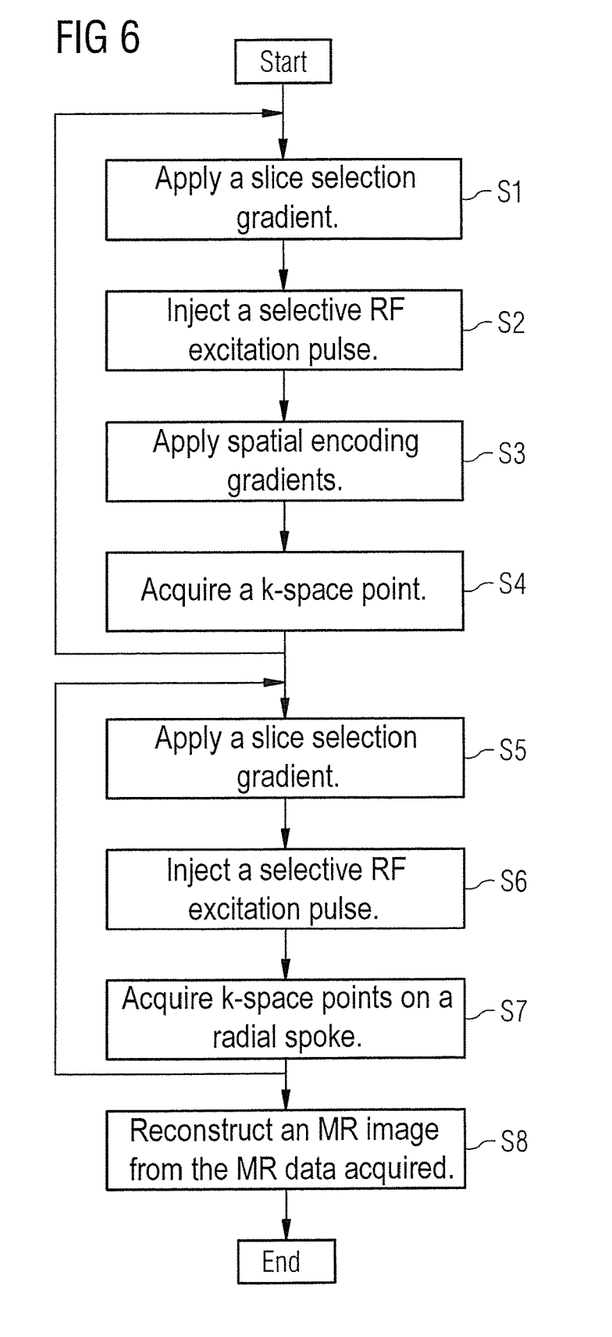
FIG. 6 is a flowchart of a method according to the invention.

FIG. 6 shows a flow chart of an inventive method for producing an MR image.

In step S1, a slice selection gradient is applied, wherein a selective RF excitation pulse is simultaneously injected in step S2, causing the magnetization to be excited within a slice. For spatial encoding in two directions, each perpendicular to the direction of the slice selection gradient, magnetic field gradients are applied in step S3. In step S4, a k-space point is acquired at the echo time.

Steps S1 to S4 are repeated until a central region of two-dimensional k-space has been sampled.

In the second part of the flow chart shown in FIG. 6, a slice selection gradient is again applied (step S5), while in step S6 a selective RF excitation pulse is injected. The k-space points lying on a radial spoke are then acquired, for which purpose at least one magnetic field gradient for frequency encoding is generally applied.

Steps S5 to S7 are repeated until the region of two-dimensional k-space outside the central region has been sampled.

From the thus acquired MR data, an MR image is reconstructed in step S8.

It should be noted that steps S1 to S4 can also be carried out after steps S5 to S7 or that steps S1 to S4 can also be carried out interleaved with steps S5 to S7.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for producing a magnetic resonance (MR) image of a volume of an examination object, comprising:
   operating an MR data acquisition unit, in which an examination object is situated, to radiate a radio-frequency (RF) excitation pulse into at least a volume of the examination object;
   operating said MR data acquisition unit to apply magnetic field gradients that produce no frequency encoding and that spatially encode magnetization of nuclear spins in said volume, that was produced by said RF excitation pulse, with only two directions in space being encoded by said spatial encoding;
   radiating said RF excitation pulse as a selective pulse by simultaneously applying a slice selection gradient in a direction in space perpendicular to said two directions in space;
   operating said MR data acquisition unit to acquire MR data for essentially a single k-space point of k-space for the radiated RF excitation pulse, and entering said MR data into an electronic memory organized as k-space at said essentially single point of k-space;
   for each of a plurality of additional essentially single k-space points, operating said MR data acquisition unit by repeating, in a plurality of repetitions, radiation of said RF excitation pulse, application of said magnetic field gradients to produce spatial encoding along only two directions in space, and acquisition of said MR data for essentially a single k-space point, and entering the MR data acquired in each repetition at respectively different essentially single k-space points in said electronic memory; and
   in a computer having access to said electronic memory, reconstructing an MR image of said volume from the MR data entered at by said plurality of essentially single k-space points in said memory, and making said MR image available in electronic form as a data file at an output of said computer.

2. A method as claimed in claim 1 comprising, during said acquisition of said MR data, applying no magnetic field gradient perpendicular to said two directions, thereby causing said reconstructed MR image to be a projection scan.

3. A method as claimed in claim 2 comprising applying said magnetic field gradients in said two directions also during radiation of said RF excitation pulse.

4. A method as claimed in claim 1 wherein said essentially single k-space point is precisely one k-space point.

5. A method as claimed in claim 1 comprising after acquiring said MR data for said essentially single k-space point, and prior to radiation of an RF excitation pulse in a next repetition, operating said MR data acquisition unit to apply a spoiler gradient that dephases said nuclear spins in said volume.

6. A method as claimed in claim 1 comprising after acquiring said MR data for said essentially single k-space point, and prior to radiation of an RF excitation pulse in a next repetition, operating said MR data acquisition unit to apply two other magnetic field gradients that refocuses said nuclear spins in said volume.

7. A method as claimed in claim 1 wherein said examination object comprises metal in a vicinity of said volume.

8. A method as claimed in claim 1 comprising repeating radiation of said RF pulse, applying said magnetic field gradients for spatial encoding in only two directions in space, and acquiring said MR data a number of times that cause k-space to be only incompletely filled, and thereby comprising k-space points that do not contain MR data, and reconstructing said MR image using compressed sampling.

9. A method for producing a magnetic resonance (MR) image of a volume of an examination object, comprising:
   operating an MR data acquisition unit, in which an examination object is situated, to acquire MR data from a volume of said examination object and entering the acquired MR data into an electronic memory organized as k-space by, in a first acquisition of said MR data, entering said MR data into a central region of k-space and, in a second acquisition of said MR data, entering said MR data into k-space outside of said central region;
   in said first acquisition, operating said MR data acquisition unit to radiate a radio-frequency (RF) excitation pulse into at least a volume of the examination object;
   also in said first acquisition, operating said MR data acquisition unit to apply magnetic field gradients that produce no frequency encoding and that spatially encode magnetization of nuclear spins in said volume that was produced by said RF excitation pulse, with only two directions in space being encoded by said spatial encoding;
   also in said first acquisition, radiating said RF excitation pulse as a selective pulse by simultaneously applying a slice selection gradient in a direction in space perpendicular to said two directions in space;
   also in said first acquisition, operating said MR data acquisition unit to acquire MR data for essentially a single k-space point of k-space for the radiated RF excitation pulse, and entering said MR data into said electronic memory organized as k-space at said essentially single point of k-space;
   also in said first acquisition, for each of a plurality of additional essentially single k-space points, operating said MR data acquisition unit by repeating, in a plurality of repetitions, radiation of said RF excitation pulse, application of said magnetic field gradients to produce spatial encoding along only two directions in space, and acquisition of said MR data for essentially a single k-space point, and entering the MR data acquired in each repetition at respectively different essentially single k-space points in said electronic memory;
   in said second acquisition of said MR data, in each of a plurality of further repetitions respectively for each of a plurality of k-space points in said region of k-space outside of said central region, operating said MR data acquisition unit by radiating a selective RF excitation pulse and acquiring MR data from said volume and entering the acquired MR data at a k-space point along a radial spoke that proceeds on a straight line through a center of k-space and that begins at an edge of said central region and ends at an outer boundary of k-space; and
   in a computer having access to said electronic memory, reconstructing an MR image of said volume from said MR data entered in said central region and said MR data entered in said region outside of said central region, and making said MR image available in electronic form as a data file at an output of said computer.

10. A magnetic resonance (MR) apparatus comprising:
   an MR data acquisition unit in which an examination object is situated, said MR data acquisition unit comprising an RF antenna and a gradient system;

a control computer configured to operate said RF antenna of said MR data acquisition unit to radiate a radio-frequency (RF) excitation pulse into at least a volume of the examination object;

said control computer being configured to operate said gradient system of said MR data acquisition unit to apply magnetic field gradients that produce no frequency encoding and that spatially encode magnetization of nuclear spins in said volume that was produced by said RF excitation pulse, with only two directions in space being encoded by said spatial encoding;

said control computer being configured to operate said RF antenna of said MR data acquisition unit to radiate said RF excitation pulse as a selective pulse by simultaneously applying a slice selection gradient in a direction in space perpendicular to said two directions in space;

an electronic memory organized as k-space;

said control computer being configured to operate said MR data acquisition unit to acquire MR data for essentially a single k-space point of k-space for the radiated RF excitation pulse, and to enter said MR data into said electronic memory at said essentially single point of k-space;

said control computer being configured for each of a plurality of additional essentially single k-space points, to operate said MR data acquisition unit to repeat, in a plurality of repetitions, radiation of said RF excitation pulse, application of said magnetic field gradients to produce spatial encoding along only two directions in space, and acquisition of said MR data for essentially a single k-space point, and to enter the MR data acquired in each repetition at respectively different essentially single k-space points in said electronic memory; and an image reconstruction computer having access to said electronic memory, configured to reconstruct an MR image, using compressed sampling, of said volume from the MR data entered at said plurality of essentially single k-space points in said memory, and to make said MR image available in electronic form as a data file at an output of said image reconstruction computer.

11. A magnetic resonance (MR) apparatus comprising:

an MR data acquisition unit in which an examination object is situated said MR data acquisition unit comprising an RF antenna and a gradient system;

a control computer configured to operate said RF antenna of said MR data acquisition unit to radiate a radio-frequency (RF) excitation pulse into at least a volume of the examination object;

said control computer being configured to operate said gradient system of said MR data acquisition unit to apply magnetic field gradients that produce no frequency encoding and that spatially encode magnetization of nuclear spins in said volume that was produced by said RF excitation pulse, with only two directions in space being encoded by said spatial encoding;

said control computer being configured to operate said RF antenna of said MR data acquisition unit to radiate said RF excitation pulse as a selective pulse by simultaneously applying a slice selection gradient in a direction in space perpendicular to said two directions in space;

an electronic memory organized as k-space;

said control computer being configured to operate said MR data acquisition unit to acquire MR data for essentially a single k-space point of k-space for the radiated RF excitation pulse, and to enter said MR data into said electronic memory at said essentially single point of k-space;

said control computer being configured, for each of a plurality of additional essentially single k-space points, to operate said MR data acquisition unit to repeat, in a plurality of repetitions, radiation of said selective RF excitation pulse, application of said magnetic field gradients to produce spatial encoding along only two directions in space, and acquisition of said MR data for essentially a single k-space point, and to enter the MR data acquired in each repetition at respectively different essentially single k-space points in a central region of k-space in said electronic memory;

said control computer being configured to operate said MR data acquisition unit, in said second acquisition of said MR data, in each of a plurality of further repetitions respectively for each of a plurality of k-space points in a region of k-space outside of said central region, to radiate an RF excitation pulse and to acquire MR data from said volume, and to enter the MR data acquired in said further repetitions at a k-space point along a radial spoke that proceeds on a straight line through a center of k-space and that begins at an edge of said central region and ends at an outer boundary of k-space; and an image reconstruction computer having access to said electronic memory, configured to reconstruct an MR image of said volume from said MR data entered in said central region and said MR data entered in said region outside of said central region, and to make said MR image available in electronic form as a data file at an output of said image reconstruction computer.

12. A non-transitory, computer-readable data storage medium encoded with programming instructions, said storage medium being loaded into a computerized control and processing system of a magnetic resonance (MR) apparatus, in which an examination object is situated, said programming instructions causing said computerized control and processing system to:

operate said MR apparatus to radiate a radio-frequency (RF) excitation pulse into at least a volume of the examination object;

operate said MR apparatus to apply magnetic field gradients that produce no frequency encoding and that spatially encode magnetization of nuclear spins in said volume, that was produced by said RF excitation pulse, with only two directions in space being encoded by said spatial encoding;

operate said MR apparatus to radiate said RF excitation pulse as a selective pulse by simultaneously applying a slice selection gradient in a direction in space perpendicular to said two directions in space;

operate said MR apparatus to acquire MR data for essentially a single k-space point of k-space for the radiated RF excitation pulse, and enter said MR data into an electronic memory organized as k-space at said essentially single point of k-space;

for each of a plurality of additional essentially single k-space points, operate said MR apparatus to repeat, in a plurality of repetitions, radiation of said RF excitation pulse, application of said magnetic field gradients to produce spatial encoding along only two directions in space, and acquisition of said MR data for essentially a single k-space point, and to enter the MR data acquired in each repetition at respectively different essentially single k-space points in said electronic memory; and reconstruct an MR image, using compressed sampling, of said volume from the MR data entered at by said plurality of essentially single k-space points in said memory, and make said MR image available in electronic form as a data file at an output of said computerized control and processing system.

13. A non-transitory, computer-readable data storage medium encoded with programming instructions, said storage medium being loaded into a computerized control and processing system of a magnetic resonance (MR) apparatus, in which an examination object is situated, said programming instructions causing said computerized control and processing system to:

operate said MR apparatus to acquire MR data from a volume of said examination object and enter the acquired MR data into an electronic memory organized as k-space by, in a first acquisition of said MR data, entering said MR data into a central region of k-space and, in a second acquisition of said MR data, entering said MR data a region of into k-space outside of said central region;

in said first acquisition, operate said MR apparatus to radiate a radio-frequency (RF) excitation pulse into at least a volume of the examination object;

also in said first acquisition, operate said MR apparatus to apply magnetic field gradients that produce no frequency encoding and that spatially encode magnetization of nuclear spins in said volume that was produced by said RF excitation pulse, with only two directions in space being encoded by said spatial encoding;

also in said first acquisition, operate said MR apparatus to radiate said RF excitation pulse as a selective pulse by simultaneously applying a slice selection gradient in a direction in space perpendicular to said two directions in space;

also in said first acquisition, operate said MR apparatus to acquire MR data for essentially a single k-space point of k-space for the radiated RF excitation pulse, and entering said MR data into said electronic memory at said essentially single point of k-space;

also in said first acquisition, for each of a plurality of additional essentially single k-space points, operate said MR apparatus to repeat, in a plurality of repetitions, radiation of said RF excitation pulse, application of said magnetic field gradients to produce spatial encoding along only two directions in space, and acquisition of said MR data for essentially a single k-space point, and to enter the MR data acquired in each repetition at respectively different essentially single k-space points in said electronic memory;

operate said MR apparatus in said second acquisition of said MR data, in each of a plurality of further repetitions respectively for each of a plurality of k-space points in said region of k-space outside of said central region, to radiate a selective RF excitation pulse and acquiring MR data from said volume and to enter the acquired MR data at a k-space point along a radial spoke that proceeds on a straight line through a center of k-space and that begins at an edge of said central region and ends at an outer boundary of k-space; and reconstruct an MR image of said volume from said MR data entered in said central region and said MR data entered in said region outside of said central region, and make said MR image available in electronic form as a data file at an output of said computerized control and processing system.

* * * * *